US012733467B2

(12) United States Patent
Nimbalkar et al.

(10) Patent No.: US 12,733,467 B2
(45) Date of Patent: Sep. 8, 2026

(54) METHODS FOR ETCH BARRIER DEPOSITION AND DEVICES MADE ACCORDING TO THE SAME

(71) Applicant: Georgia Tech Research Corporation, Atlanta, GA (US)

(72) Inventors: Pratik Nimbalkar, Atlanta, GA (US); Mohanalingam Kathaperumal, Atlanta, GA (US); Madhavan Swaminathan, Atlanta, GA (US); Rao R. Tummala, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 746 days.

(21) Appl. No.: 18/182,032

(22) Filed: Mar. 10, 2023

(65) Prior Publication Data

US 2023/0215762 A1 Jul. 6, 2023

Related U.S. Application Data

(63) Continuation of application No. 18/083,863, filed on Dec. 19, 2022, now abandoned.

(60) Provisional application No. 63/290,669, filed on Dec. 17, 2021.

(51) Int. Cl.
*H10W 20/00* (2026.01)

(52) U.S. Cl.
CPC ....... *H10W 20/054* (2026.01); *H10W 20/043* (2026.01); *H10W 20/057* (2026.01)

(58) Field of Classification Search
CPC ......... H01L 21/76865; H01L 21/76873; H01L 21/76879; H01L 21/76885; H10W 20/054; H10W 20/043; H10W 20/057; H10W 20/063
See application file for complete search history.

(56) References Cited

U.S. PATENT DOCUMENTS

2019/0363046 A1* 11/2019 Sankman .............. H01L 21/486
2021/0028115 A1* 1/2021 Bao .................. H01L 23/53266
2021/0280463 A1* 9/2021 Ecton .................. H01L 23/5226
2022/0139858 A1* 5/2022 Maniscalco ............. H01L 24/11
257/737

* cited by examiner

*Primary Examiner* — Julia Slutsker
(74) *Attorney, Agent, or Firm* — TROUTMAN PEPPER LOCKE LLP; Ryan A. Schneider; Korbin M. Blunck

(57) ABSTRACT

Disclosed herein are methods for etch barrier deposition that can include depositing a seed layer onto a substrate, depositing a metal layer onto the seed layer in a predetermined pattern, coating the metal layer with a barrier layer, directionally etching the barrier layer from a direction orthogonal to the substrate such that at least a portion of the barrier layer oriented parallel to the direction of the directional etching remains coated on the metal layer, and etching the portion of the seed layer to remove the seed layer from the substrate.

20 Claims, 7 Drawing Sheets

METHODS FOR ETCH BARRIER DEPOSITION AND DEVICES MADE ACCORDING TO THE SAME

CROSS-REFERENCE TO RELATED APPLICATIONS

This application is a continuation of, and claims priority under 35 U.S.C. § 120 to, U.S. patent application Ser. No. 18/083,863, filed on 19 Dec. 2022, which claims priority under 35 U.S.C. § 119(e) to U.S. Provisional Application No. 63/290,669, filed on 17 Dec. 2021, and the entire contents and substance of each is incorporated herein by reference in its entirety as if fully set forth below.

FIELD OF THE DISCLOSURE

The present disclosure relates generally to etch barrier deposition methods for improving the yield of fine lines and spaces as well as preventing/minimizing electromigration. Particularly, embodiments of the present disclosure relate to directional etching of barrier layers to reveal an active layer on a substrate.

BACKGROUND

There is growing demand for high performance computing with miniaturization in many electronic systems, such as servers for cloud computing, accurate weather prediction, smart mobile and wearable devices, and autonomous driving cars. The development of 2.5D silicon interposers for heterogeneous integration of graphical processing units (GPUs) to high-bandwidth memory (HBM) dies can address this demand to a certain extent. The back-end-of-line (BEOL) redistribution layer (RDL) processes in silicon interposers have reached a peak with a data rate per signal trace due to the high resistance and capacitance of BEOL RDL, limiting the system bandwidth for 2.5D silicon interposers. The cost of such interposers is also high for large body size substrates (>1200 sq. mm) due to the fabrication on wafer-based platforms. Hence, such interposers have been primarily used for cost-insensitive applications, such as cloud computing.

More recently, panel-based organic package substrates using a polymer dielectric have been under development. These panel-based substrates bring down the cost of high-performance computing systems; however, such panel-based substrates have not been able to scale multi-layer RDL below 5 microns, which is the primary requirement for 2.5D interposer substrates. The bottleneck for achieving fine lines at the panel level is the copper seed layer etching step during which the seed layer copper is removed. However, if the etching time of the seed layer is significant, then the fine line layers, in particular, the side walls of the fine lines are also etched, which leads to reduced line width as well as increased side-wall roughness. In order to overcome this problem, the polymer etch barrier layers have been demonstrated where the polymer layer is very thick—about a few hundred nanometers. This creates a challenge with respect to the minimum feature sizes achievable. Because of the thicker barrier, the spacing between the lines needs to be large enough to accommodate the barrier coating. The thicker polymer coating has to be left on the redistribution layers as it cannot be etched away. As the polymer barrier has poor thermal and mechanical properties, it can create problems in terms of the electrical and mechanical reliability of the package substrates. There is a limited number of materials that can be used as a polymer barrier and can be conformally deposited. Because of the slower vapor deposition rates of polymers, it can take a significant amount of deposition time, thereby affecting the overall process throughput. Also, such processes can require the use of specialized deposition equipment for the use of polymer barriers.

Copper seed-layer etching is one of the most important steps in traditional semi-additive processing (SAP). It is very critical to accurately control the copper etch rate for achieving fine-line redistribution layers (RDL). However, due to the isotropic nature of the chemical etchants, it has proven to be the main bottleneck in developing fine line RDL using SAP. Using the traditional wet etchants, over-etching of copper seed-layer can result in large reductions in the dimensions of RDL traces. Dry etching processes can be used for copper seed removal with tight process control. However, dry etching does not provide the throughput and cost advantage that comes with wet processing.

What is needed, therefore, are wet semi-additive process steps that can achieve very fine RDL lines and spaces with a tight process control while retaining improved throughput and high yield. Embodiments of the present disclosure address this need as well as other needs that will become apparent upon reading the description below in conjunction with the drawings.

BRIEF SUMMARY OF THE DISCLOSURE

The present disclosure relates generally to etch barrier deposition methods. Particularly, embodiments of the present disclosure relate to directional etching of barrier layers to reveal an active layer on a substrate.

An exemplary embodiment of the present disclosure can provide a method for etch barrier deposition, the method comprising: depositing a seed layer onto a substrate, the seed layer comprising a metal material and the substrate comprising a dielectric material; depositing a metal layer onto the seed layer, the metal layer being deposited in a predetermined pattern onto the seed layer; coating the metal layer with a barrier layer such that the barrier layer conforms to the predetermined pattern of the metal layer; directionally etching the barrier layer from a direction orthogonal to the substrate such that at least a portion of the seed layer and the metal layer are exposed, wherein at least a portion of the barrier layer oriented parallel to the direction of the directional etching remains coated on the metal layer; and etching the portion of the seed layer to remove the seed layer from the substrate, the etching performed with an etching material configured to have a low reactivity with the barrier layer such that the portion of the barrier layer remains coated on the metal layer.

In any of the embodiments disclosed herein, the method can further comprise: etching the barrier layer remaining coated on the metal layer with a material configured to have a low reactivity with the metal material such that the metal in the predetermined pattern remains on the substrate.

In any of the embodiments disclosed herein, the method can further comprise: depositing an intermediate layer between the seed layer and the substrate, the intermediate layer configured to provide adhesion between the seed layer and the substrate; and etching the intermediate layer in conjunction with the barrier layer such that the metal in the predetermined pattern remains on the substrate.

In any of the embodiments disclosed herein, depositing the metal layer onto the seed layer can comprise: depositing a photoresist material onto the seed layer, the deposition including photoresist application, photolithography, and photoresist development; electro-depositing the metal material into the predetermined pattern determined by the photoresist material; and stripping the photoresist material such that the metal material remains on the metal layer in the predetermined pattern.

In any of the embodiments disclosed herein, coating the metal layer with the barrier layer can comprise: coating the metal layer with a barrier precursor; and causing a chemical reaction in the barrier precursor to form the barrier layer.

In any of the embodiments disclosed herein, coating the metal layer with the barrier layer can be performed by one or more of: physical vapor deposition, chemical vapor deposition, sputtering, spray coating, or liquid coating.

In any of the embodiments disclosed herein, directionally etching the barrier layer can be performed by one or more of: plasma etching, reactive ion etching, or wet chemical etching.

In any of the embodiments disclosed herein, directionally etching the barrier layer can be performed anisotropically.

In any of the embodiments disclosed herein, the predetermined pattern can result in a metal wire having a width from 0.1 microns to 10 microns.

In any of the embodiments disclosed herein, the predetermined pattern can result in a metal wire having a ratio of width to height from 1:0.1 to 1:10.

Another embodiment of the present disclosure can provide a metal wire, device, or circuit pattern formed by the method of any of the embodiments disclosed herein.

Another embodiment of the present disclosure can provide a method for etch barrier deposition, the method comprising: depositing a seed layer onto a substrate, the seed layer comprising an active material and the substrate comprising a dielectric material; depositing an active layer onto the seed layer, the active layer being deposited in a predetermined pattern onto the seed layer; coating the active layer with a barrier layer such that the barrier layer conforms to the predetermined pattern of the active layer; directionally etching the barrier layer from a direction orthogonal to the substrate such that at least a portion of the seed layer and the active layer are exposed, wherein at least a portion of the barrier layer oriented parallel to the direction of the directional etching remains coated on the active layer; and etching the portion of the seed layer to remove the seed layer from the substrate, the etching performed with an etching material configured to have a low reactivity with the barrier layer such that the portion of the barrier layer remains coated on the active layer.

In any of the embodiments disclosed herein, the method can further comprise: etching the barrier layer remaining coated on the active layer with a material configured to have a low reactivity with the active material such that the active material in the predetermined pattern remains on the substrate.

In any of the embodiments disclosed herein, the method can further comprise: depositing an intermediate layer between the seed layer and the substrate, the intermediate layer configured to provide adhesion between the seed layer and the substrate; and etching the intermediate layer in conjunction with the barrier layer such that the active material in the predetermined pattern remains on the substrate.

In any of the embodiments disclosed herein, depositing the active layer onto the seed layer can comprise: depositing a photoresist material onto the seed layer, the deposition including photoresist application, photolithography, and photoresist development; electro-depositing the active material into the predetermined pattern determined by the photoresist material; and stripping the photoresist material such that the active material remains on the active layer in the predetermined pattern.

In any of the embodiments disclosed herein, coating the active layer with the barrier layer can comprise: coating the active layer with a barrier precursor; and causing a chemical reaction in the barrier precursor to form the barrier layer.

In any of the embodiments disclosed herein, coating the active layer with the barrier layer can be performed by one or more of: physical vapor deposition, chemical vapor deposition, sputtering, spray coating, or liquid coating.

In any of the embodiments disclosed herein, directionally etching the barrier layer can be performed by one or more of: plasma etching, reactive ion etching, or wet chemical etching.

In any of the embodiments disclosed herein, directionally etching the barrier layer can be performed anisotropically.

In any of the embodiments disclosed herein, the predetermined pattern can result in a wire having a width from 0.1 microns to 10 microns.

In any of the embodiments disclosed herein, the predetermined pattern can result in a wire having a ratio of width to height from 1:0.1 to 1:10.

In any of the embodiments disclosed herein, the active material can comprise one or more of: a metal, a ceramic, a polymer, an organic material, or an inorganic material.

Another embodiment of the present disclosure can provide a wire, device, or circuit pattern formed by the method of any of the embodiments disclosed herein.

These and other aspects of the present disclosure are described in the Detailed Description below and the accompanying figures. Other aspects and features of embodiments of the present disclosure will become apparent to those of ordinary skill in the art upon reviewing the following description of specific, exemplary embodiments of the present invention in concert with the figures. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The accompanying drawings, which are incorporated in and constitute a part of this specification, illustrate multiple embodiments of the presently disclosed subject matter and serve to explain the principles of the presently disclosed subject matter. The drawings are not intended to limit the scope of the presently disclosed subject matter in any manner.

FIG. 1A provides a scanning electron microscopy (SEM) image of an example substrate having redistribution layers after conventional copper differential etch.

FIGS. 2A & 2B provide a comparison between conventional copper differential etch and zero side-wall etching using an inorganic etch barrier material for forming fine line redistribution layers, in accordance with an exemplary embodiment of the present invention.

DETAILED DESCRIPTION

Figure 1B:
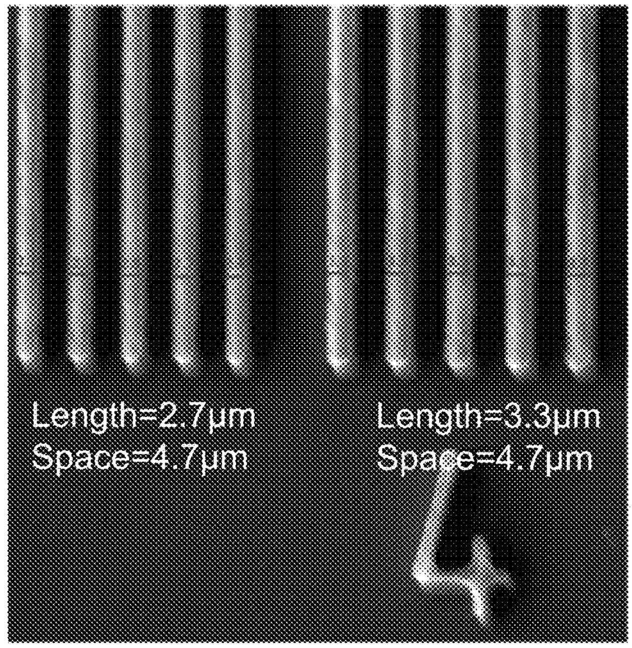
FIG. 1B provides an SEM image of an example substrate having redistribution layers after zero side-wall etch process using an inorganic etch barrier material and after etching four times, in accordance with an exemplary embodiment of the present invention, with inset photos of the barrier coating.
Figure 1B:
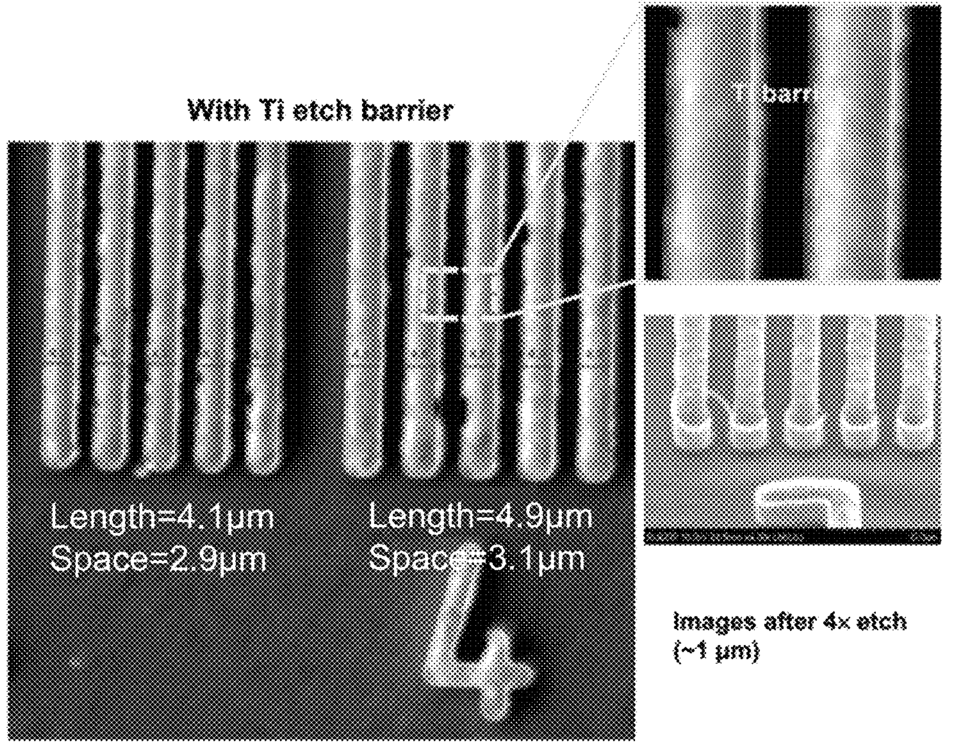

The present disclosure corresponds to formation of fine line redistribution layers using semi-additive processes. An inorganic barrier material can be coated on an electro-deposited metal pattern. The barrier material can be coated such that it covers the longitudinal surfaces of the pattern and is absent from the lateral surfaces. In other words, the barrier layer can be directionally etched from a direction orthogonal to the barrier layer such that the barrier layer orthogonal to the etching (the lateral surface) is removed, while the barrier layer parallel to the etching (the longitudinal surface) remains.

The process for forming such a barrier can utilize a conformal deposition of the barrier material on the metal layer, followed by anisotropic or directional etching so as to remove the barrier material from the lateral surfaces (orthogonal to the direction of etching). After the deposition of the barrier, chemical etching of deposited metal can be performed. The barrier material can be selected such that it is non-reactive towards the etching chemical used for removing the seed layer. Thus, the barrier can protect the metal pattern from the etching effect of chemicals. Once the underlying seed layer metal is etched away, the barrier material can be removed using a different etching chemical. The barrier coating can be optionally left as is to act as a barrier layer against ionic migration or electromigration.

The present disclosure can utilize traditionally used processes and tools for semi-additive processing. This can eliminate a need for newer equipment or refurbishment of existing tools. The present disclosure can also extend the capabilities of existing methods for formation of finer features using semi-additive processes. Furthermore, semi-additive processing can take advantage of lower costs than other alternative methods, such as dual damascene processes used in back-end integrated circuit (IC) packaging.

The present disclosure can improve processes and implement desirable methods in applications such as (non-exhaustively listed in no particular order) semiconductor package substrate manufacturing, artificial intelligence, high-performance computing, data-centers, self-driving vehicles, 5G, 6G (and beyond), and the like. Package substrates used in such applications can take advantage of high-bandwidth chip-to-chip interfaces necessitating high-density redistribution layers. The present disclosure can provide superior process control in the manufacturing of high-density redistribution layers. Another set of applications can include, but is not limited to, package substrates for RF, microwave, mmWave, terahertz, and higher frequency applications that require fine control of various system components such as antennas, waveguides, filters, and the like.

Although certain embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. Other embodiments of the disclosure are capable of being practiced or carried out in various ways. Also, in describing the embodiments, specific terminology will be resorted to for the sake of clarity. It is intended that each term contemplates its broadest meaning as understood by those skilled in the art and includes all technical equivalents which operate in a similar manner to accomplish a similar purpose.

Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" are intended to be open-ended and to reflect that structure, material, or acts are not necessary, the failure to use such terms is not intended to reflect that structure, material, or acts are essential. To the extent that structure, material, or acts are presently considered to be essential, they are identified as such.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified.

The components described hereinafter as making up various elements of the disclosure are intended to be illustrative and not restrictive. Many suitable components that would perform the same or similar functions as the components described herein are intended to be embraced within the scope of the disclosure. Such other components not described herein can include, but are not limited to, for example, similar components that are developed after development of the presently disclosed subject matter.

Reference will now be made in detail to exemplary embodiments of the disclosed technology, examples of which are illustrated in the accompanying drawings and disclosed herein. Wherever convenient, the same references numbers will be used throughout the drawings to refer to the same or like parts.

Figure 2B:
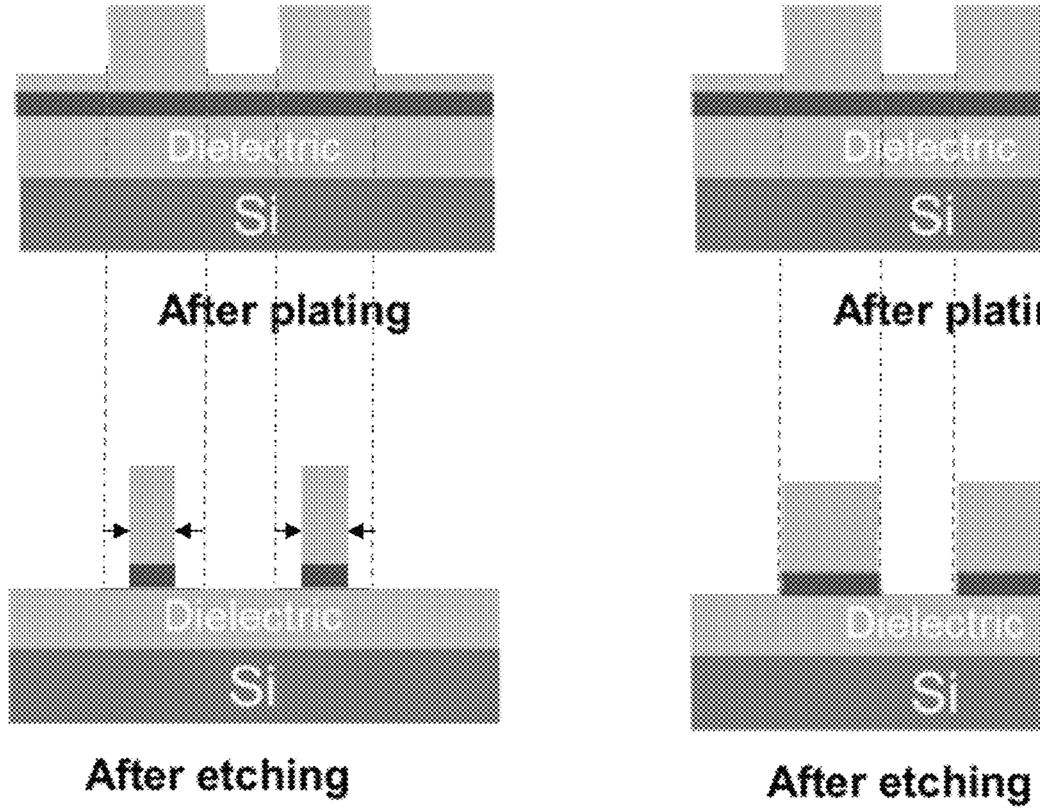

FIGS. 1A and 1B show SEM images comparing devices produced by etching processes. FIG. 2A provides an additional schematic of the device shown in FIG. 1A, and FIG. 2B provides an additional schematic of the device shown in FIG. 1B. In FIG. 1A and FIG. 2A, a conventional copper differential etch can result in a large reduction in the dimensions of the redistribution line traces. Compared to FIG. 1B and FIG. 2B, which show the processes disclosed herein, the difference in sizes in the lines and the space dimensions in the redistribution lines are apparent.

Figure 3:
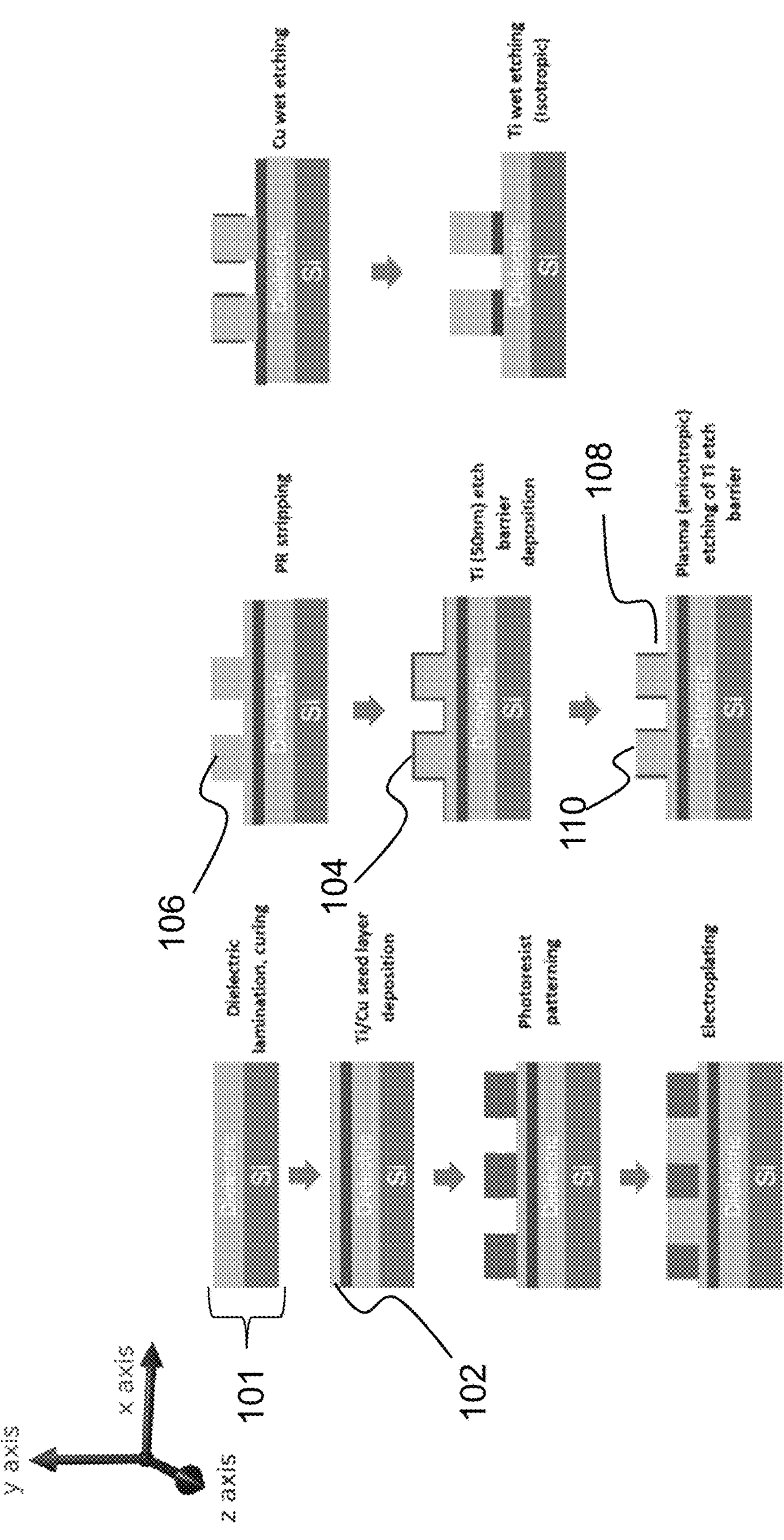
FIG. 3 provides an example process flow for forming fine line redistribution layers on a substrate using an inorganic etch barrier material, in accordance with an exemplary embodiment of the present invention.

As shown in FIG. 1B and FIG. 2B, the metal layer can be deposited in a predetermined pattern onto the seed layer, the deposition of which is described in greater detail in FIG. 3. The barrier layer can be deposited to conform to the predetermined pattern such that the metal layer retains this form factor after etching. The predetermined pattern can be configured to form a wire, a circuit pattern, or any other such device.

In a metal wire predetermined pattern, the wire can have a width from approximately 0.1 microns to approximately 10 microns (e.g., from 0.2 microns to 10 microns, from 0.3 microns to 10 microns, from 0.4 microns to 10 microns, from 0.5 microns to 10 microns, from 0.6 microns to 10 microns, from 0.7 microns to 10 microns, from 0.8 microns to 10 microns, from 0.9 microns to 10 microns, from 1 micron to 10 microns, from 2 microns to 10 microns, from 3 microns to 10 microns, from 4 microns to 10 microns, from 5 microns to 10 microns, from 0.1 microns to 5 microns, from 0.1 microns to 4 microns, from 0.1 microns to 3 microns, from 0.1 microns to 2 microns, or from 0.1 microns to 1 micron).

In a metal wire predetermined pattern, the wire can have a ratio of width to height from approximately 1:0.1 to 1:10 (e.g., from 1:0.2 to 1:10, from 1:03 to 1:10, from 1:0.4 to 1:10, from 1:0.5 to 1:10, from 1:0.6 to 1:10, from 1:0.7 to 1:10, from 1:0.8 to 1:10, from 1:0.9 to 1:10, or from 1:1 to 1:10).

As shown in FIG. 3, the disclosed processes can be semi-additive processes. In particular, the method for forming redistribution layers on a substrate 301 can include depositing a seed layer 302 on the substrate 301. Then, the method can include depositing a barrier material 304 on a patterned surface 306 and etching the seed layer 302 such that the barrier material 304 remains intact. In particular, the barrier material 304 can be selected such that it is non-reactive towards the etching agent used to etch the seed layer. The patterned surface 306, or the predetermined pattern, can have a longitudinal surface 308 and a lateral surface 310. The longitudinal surface 308 can be perpendicular to the substrate 301 and extend along the height of the pattern, for instance, along the y-axis. The lateral surface 310 can be parallel to the substrate 301 and extend along the length of the pattern, for instance, along the x-axis. The method can include directionally etching the barrier material 304 from the lateral surface 310 of the patterned surface 306. The directional etching of the barrier material 304 on the lateral surface 310 can occur before or after etching the seed layer 302.

While the seed layer 302 can comprise a metal material, the seed layer can alternatively or additionally comprise an active material. The active material can include a metal, a ceramic, a polymer, an organic material, or an inorganic material, certain examples of which are described in further detail below.

The substrate 301 can include semiconductors, dielectrics, glass, silicon, copper, or any suitable material or combination thereof for integrated circuit packaging. The seed layer 302 can include metals such as titanium, copper, iron, lead, gold, aluminum, platinum, uranium, zinc, lithium, sodium, tin, silver and the like. Seed layer 302 can also include alloys with base metals of aluminum, beryllium, bismuth, chromium, cobalt, copper, gallium, gold, indium, iron, lead, magnesium, manganese, mercury, nickel, plutonium, potassium, rare earths, rhodium, samarium, scandium, silver, sodium, titanium, tin, and uranium. In some examples, the seed layer 302 can be readily removed using a wet-etching process.

The active layer can be deposited onto the seed layer 302 in a predetermined pattern to form the patterned surface 306. The predetermined pattern can be any suitable form factor for integrated circuit packaging or other applications as desired, including, but not limited to, a metal wire, device, or circuit pattern. The barrier layer (i.e., the barrier material 304) can be coated on the active layer such that the barrier material 304 conforms to the predetermined pattern (i.e., the patterned surface 306).

As described above, the barrier material 304 can be directionally etched from a direction orthogonal to the substrate 301 (and, therefore, orthogonal to the lateral surface 310). In such a manner, the portions of the barrier material 304 on the lateral surface 310 can be etched from the orthogonal direction, while the portions of the barrier material 304 on the longitudinal surface 308 (parallel to the orthogonal direction) can remain coated on the active layer (the patterned surface 306).

Subsequently, the seed layer 302 can be etched to remove the seed layer 302 from the substrate 301. This etching can be performed with an etching material or etching agent configured to have a low reactivity with the barrier material 304. In such a manner, while the seed layer 302 is etched and removed from the substrate 301, the portions of the active material (on patterned surface 306) can be protected by the portions of the barrier material 304 on the longitudinal surface 308 that remained coated on the active layer after the directional etching. In other words, the barrier material 304 that remains can protect the patterned surface 306 while the seed layer 302 is etched away. Once the seed layer 302 is removed, the remaining barrier material 304 on the longitudinal surface 308 can be etched and removed by an etching material that has a low reactivity with the active material. In such a manner, the active material in the patterned surface 306 can be revealed and/or exposed on the substrate 301 while the remaining barrier material 304 is removed.

The disclosed methods can also include depositing an intermediate layer (not shown) between the seed layer 302 and the substrate 301 that can provide adhesion between the seed layer 302 and the substrate 301. Suitable examples of an intermediate layer can include, but are not limited to, Titanium, chromium, aluminum, tungsten, platinum, tantalum, cobalt, niobium, molybdenum, CoW, CoWP, TaN, TiN, and the like. Etching the barrier material 304 can also be performed with an etching agent that can etch the intermediate layer with the barrier material 304. In such a manner, the substrate 301 can be exposed along with the patterned surface 306 while removing the barrier material 304 and the intermediate layer.

Common etching agents suitable for wet-etching processes can include etchants such as, for example, Adler Etchant (copper ammonium chloride, hydrochloric acid, $FeCl_3$, and DI Water), ammonium persulfate, aluminum Al—NaOH, Berahas Etchant ($Na_2S_2O_3$, $K_2S_2O_5$, and DI Water), Carpenters Stainless Steel Etch ($FeCl_3$, $CuCl_2$, hydrochloric acid, nitric acid, and ethanol), Copper No. 1 (nitric acid and DI water), Copper No. 2 (hydrochloric acid, ferric chloride, and DI water), Copper Sulfate Passivation (hydrochloric acid, ferric chloride, and DI water), Dichromate Etchant ($K_2Cr_2O_7$, sulfuric acid, saturated NaCl, and DI water), Frys Reagent (hydrochloric acid, copper chloride, DI water, and alcohol), Inconel etchant (nitric acid, hydrochloric acid, hydrogen peroxide (30%), and DI water), Kalling's No. 2 ($CuCl_2$, hydrochloric acid, and ethanol), Kellers etch (DI water, nitric acid, hydrochloric acid, and hydrofluoric acid) Kroll's reagent (DI water, nitric acid, and hydrofluoric acid), and the like. The etching agents can also include any combinations of one or more of the above-mentioned etching agents.

Various methods for etching can be used in conjunction with the disclosed methods. For instance, the etching can include plasma etching, reactive ion etching, wet chemical etching, or a combination thereof. The etching can further be any etching method that is performed anisotropically.

In some embodiments, the barrier material 304 can be a metal such as titanium, copper, iron, lead, gold, aluminum, platinum, uranium, zinc, lithium, sodium, tin, silver or combinations thereof. In particular, the barrier material 304 can be a material that is resistant to the etching agent used to remove the seed layer 302. Alternatively, or in addition, the barrier material 304 can be formed from a barrier precursor coated onto the patterned surface 306. A chemical reaction can transform the barrier precursor into the barrier material 304. For example, the barrier precursor can include tetraethylorthosilicate (TEOS) for forming $SiO_2$; or other sol-gel precursors to form respective reaction products. Passive oxide films such as-$Al_2O_3$ and $TiO_2$ can form their metal films Al and Ti, respectively, by thermal or chemical oxidation.

The barrier material 304 can be applied to the patterned surface 306 in a variety of ways. Suitable examples of coating the active layer (the patterned surface 306) can include, but are not limited to, physical vapor deposition, chemical vapor deposition, sputtering, atomic layer deposition, spray coating, liquid coating, or combinations thereof.

The active layer can be deposited onto the seed layer 302 in a variety of ways to form the predetermined pattern (e.g., the patterned surface 306). The disclosed methods can deposit a photoresist material onto the seed layer 302 by photoresist application, photolithography, and photoresist development. The active material can then be applied in a predetermined pattern to form the patterned surface 306 by electrodeposition. Finally, the photoresist material can be stripped such that the active material remains on the active layer in the patterned surface 306 (conforming to the predetermined pattern). These steps can be repeated and applied as necessary to form the active layer. The disclosed methods can utilize photolithography, photoresist development, electrodeposition, and photoresist removal to extend applications of the active layer to a variety of active materials disclosed herein.

Figure 4A:
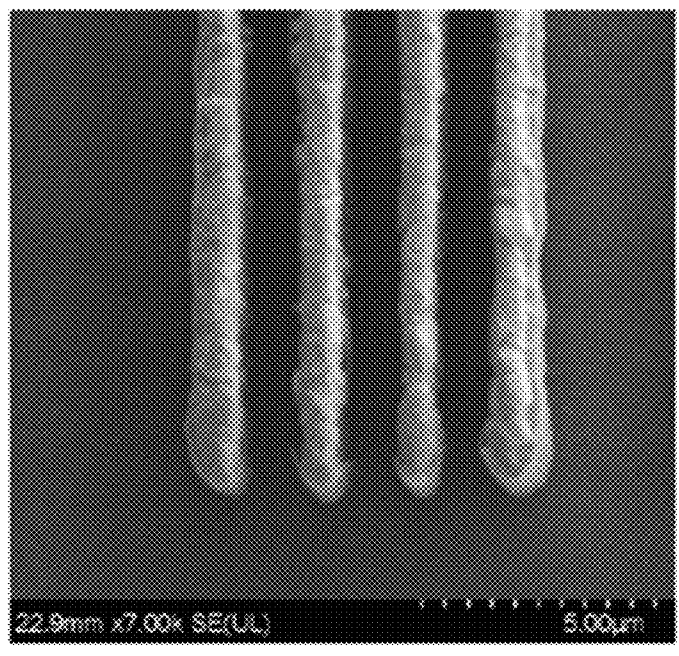
FIGS. 4A & 4B provide SEM images of redistribution layers on a substrate with an inorganic barrier material after a copper over-etch, in accordance with an exemplary embodiment of the present invention.
Figure 4B:
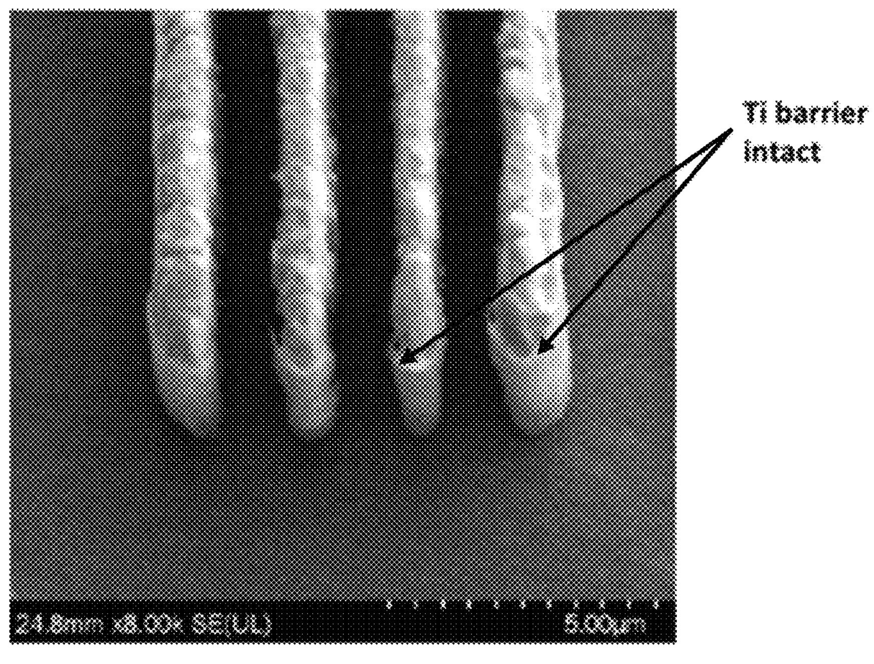
Figure 5A:
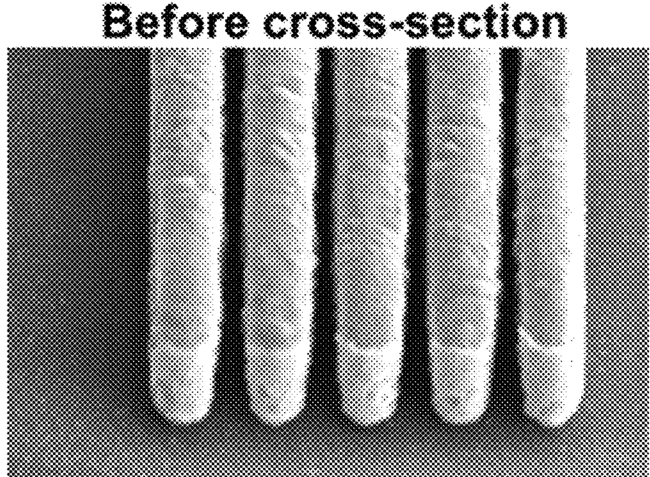
FIGS. 5A & 5B provide SEM images before (FIG. 5A) and after (FIG. 5B) cross-section of redistribution layers on a substrate with an inorganic barrier material after a copper over-etch, in accordance with an exemplary embodiment of the present invention.
Figure 5B:
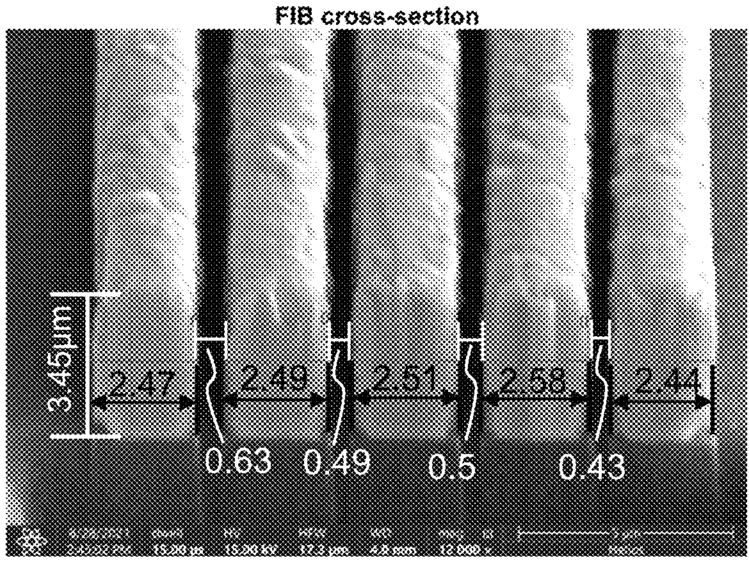

In some embodiments, using the zero side-wall etching method can generate redistribution lines dimensions that are substantially similar to the patterned surface dimensions due to the thin barrier protecting the patterned surface during wet-etching. Such results are shown in FIGS. 4A & B and 5A & B.

Figure 6:
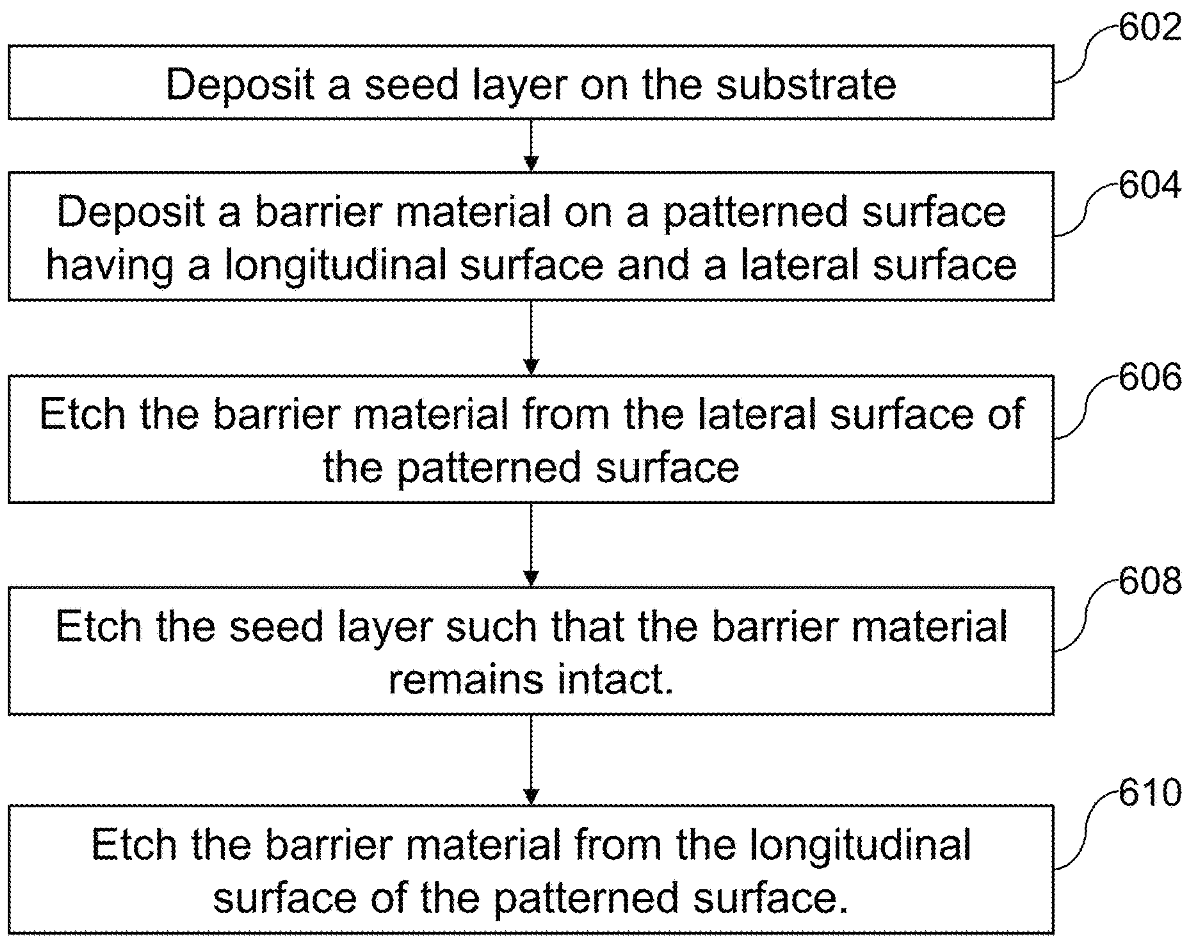
FIG. 6 provides a flowchart of a method for forming redistribution layers on a substrate, in accordance with an exemplary embodiment of the present invention.

FIG. 6 provides a flowchart of a method 600 for forming redistribution layers on a substrate. In particular, the method can include depositing 602 a seed layer on the substrate. The method can also include depositing 604 a barrier material on a patterned surface having a longitudinal surface and a lateral surface. The method can further include etching 606 the barrier material from the lateral surface of the patterned surface. In addition, the method can include etching 608 the seed layer such that the barrier material remains intact. Method 600 can end after step 608. In some examples, method 600 can further include etching 610 the barrier material from the longitudinal surface of the patterned surface.

Figure 7:
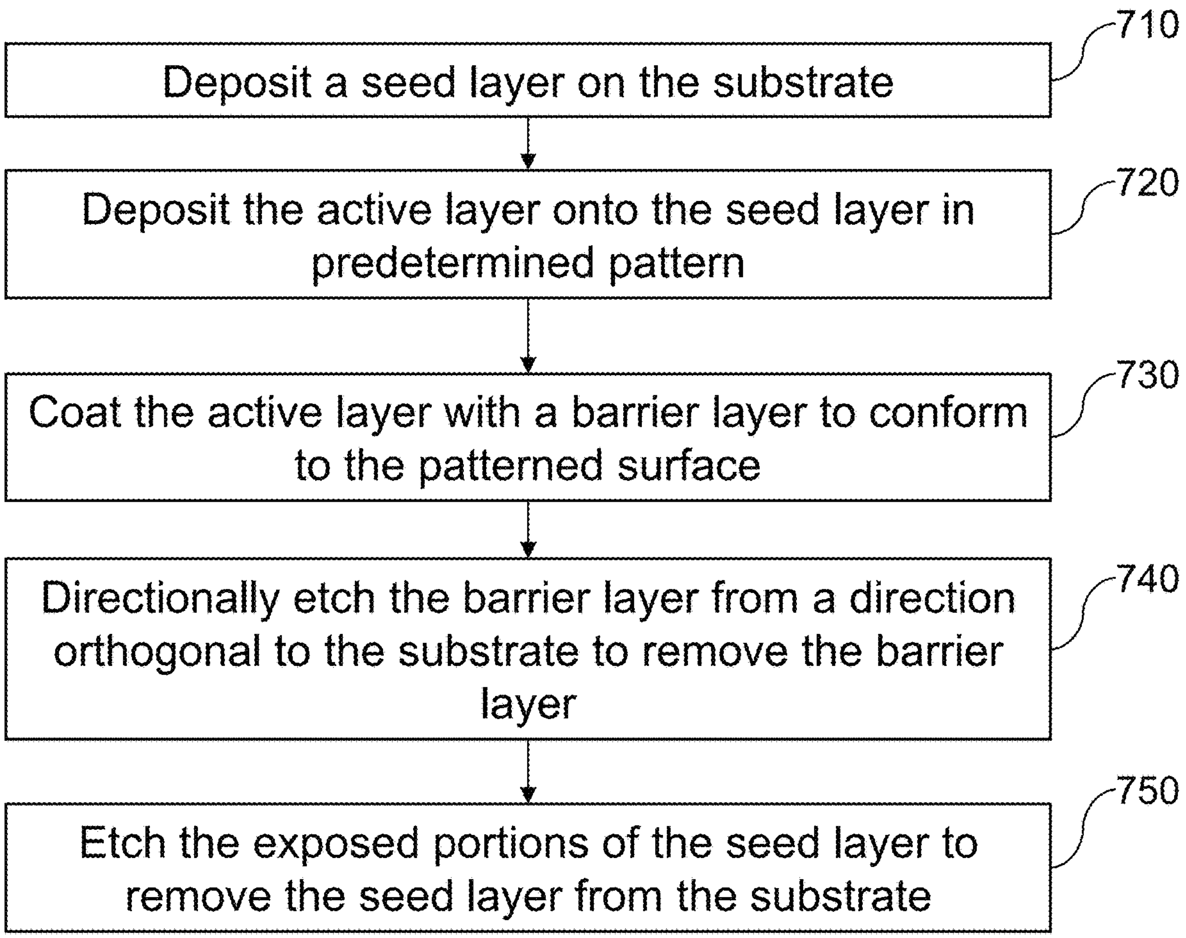
FIG. 7 provides a flowchart of a method for etch barrier deposition on a substrate, in accordance with an exemplary embodiment of the present invention.

FIG. 7 provides a flowchart of a method 700 for etch barrier deposition. As shown, in block 710, the method 700 can comprise depositing a seed layer 302 onto a substrate 301. The seed layer 302 can comprise an active material as described above, and the substrate 301 can comprise any material as desired, as described above. The deposition of the seed layer 302 can take place using a variety of deposition methods used for semi-additive processes. The method 700 can then proceed on to block 720.

In block 720, the method 700 can comprise depositing an active layer onto the seed layer 302. The active layer can be deposited in a predetermined pattern onto the seed layer 302 to form the patterned surface 306. The predetermined pattern can be, for instance, a wire, device, circuit pattern, integrated circuit, chip, and the like. Depositing the active layer can be performed in multiple steps. For example, the deposition can comprise depositing a photoresist material onto the seed layer 302 by photoresist application, photolithography, and photoresist development. Such a step can be followed by electrodeposition of the active material in the predetermined pattern, which can be set by the photoresist material to form the patterned surface 306. Such a step can further be followed by stripping the photoresist material such that the active material remains on the active layer in the predetermined pattern to thereby form the patterned surface 306. The method 700 can then proceed on to block 730.

In block 730, the method 700 can comprise coating the active layer with a barrier layer 304. The barrier layer 304 can conform to the patterned surface 306 such that the barrier layer 304 is also in the predetermined pattern. The barrier layer 304 can comprise a variety of materials as described above. For example, coating the active layer with the barrier layer 304 can be performed by one or more of physical vapor deposition, chemical vapor deposition, sputtering, atomic layer deposition, spray coating, liquid coating, a combination thereof, or other similar methods. Coating the active layer can also be performed in multiple steps. For example, the coating can include coating the active layer with a barrier precursor, followed by causing a chemical reaction in the barrier precursor to form the barrier layer 304. The method 700 can then proceed on to block 740.

In block 740, the method 700 can comprise directionally etching the barrier layer 304 from a direction orthogonal to the substrate 301. The directional etching can be performed by one or more of plasma etching, reactive ion etching, wet chemical etching, combinations thereof, or other similar methods. The directional etching can thereby also be from a direction orthogonal to the lateral surface 310. In such a manner, the portions of the barrier layer 304 on the lateral surface 310 can be etched to expose a portion of the seed layer 302 and a portion of the active layer. Further, the directional etching can also thereby be from a direction parallel to the longitudinal surface 308. Because the etching is directional, the portion of the barrier layer 304 on the longitudinal surface 308 can remain coated on the active layer. The method 700 can then proceed on to block 750.

In block 750, the method 700 can comprise etching the exposed portion of the seed layer 302 to remove the seed layer 302 from the substrate 301. Such etching can be performed with an etching material as described above that also has a low reactivity with the barrier layer 304. In such a manner, the portion of the barrier layer 304 remaining on the active layer on the longitudinal surface 308 can remain on the active layer. The method 700 can then end after block 750 or proceed on to other method steps disclosed herein but not shown in FIG. 7.

For example, after etching the seed layer 302 in block 750, the method can further include etching the portion of the barrier layer 304 on the longitudinal surface 308. Such etching can be performed with an etching material as descried above that also has a low reactivity with the active material such that the active layer is not etched. In other words, the barrier layer 304 can be fully removed while leaving the patterned surface 306 intact on the substrate 301.

By way of another example, the method can further include depositing an intermediate layer between the seed layer 302 and the substrate 301. The intermediate layer can comprise a material that provides adhesion between the seed layer 302 and the substrate 301. In such an example, the intermediate layer can be etched in conjunction with the barrier layer 304 to fully expose the patterned surface 306 on the substrate 301.

This invention corresponds to formation of fine line redistribution layers using semi-additive processes. An inorganic barrier material is coated on the electro-deposited metal pattern. The barrier material is coated such that it covers the longitudinal surfaces of the pattern and is absent from the lateral surfaces. The process for forming such a barrier involves conformal deposition of barrier material on the metal pattern followed by anisotropic or directional etching so as to remove the barrier material from the lateral surfaces. After the deposition of barrier, chemical etching of deposited metal can be performed. The barrier material is selected such that it is non-reactive towards the etching chemical used for removing the seed-layer metal. Thus, the barrier protects the metal pattern from the etching effect of chemicals. Once the underlying seed-layer metal is etched away, the barrier material can be removed using a different etching chemical. The barrier coating can be optionally left as is to act as a barrier layer against ionic migration or electromigration.

The process flow involves formation of metal features using the conventional semi-additive processes (SAP) as shown in the FIG. 3. Photoresist patterning using lithography is followed by electrodeposition to fill up the pattern areas. Photoresist striping is performed to remove the photoresist completely. A thin layer of barrier material is conformally deposited on the pattern so as to cover lateral and longitudinal surfaces uniformly. The process of deposition can be sputtering or vapor deposition resulting in conformal deposition of barrier material. The barrier material is selected such that the chemicals used for metal seed-layer etching won't react with the barrier material. After barrier material deposition, anisotropic or directional etching process is utilized to remove the barrier material from the lateral surfaces as shown in the figure above. The barrier material should remain on the side-walls or the longitudinal surfaces of the pattern. The next step involves wet etching of the underlying metal seed-layer using chemical etchants. Over-etching of the metal seed-layer can be performed to ensure its complete removal. The sides-walls or the longitudinal surfaces are protected by the barrier material. The barrier material can be optionally removed from the side-walls using different chemical etchants that are non-reactive towards the metal pattern. The barrier can be left as is for protection against ionic migration or electro-migration effects during the operation of the device.

While the present disclosure has been described in connection with a plurality of exemplary aspects, as illustrated in the various figures and discussed above, it is understood that other similar aspects can be used, or modifications and additions can be made to the described aspects for performing the same function of the present disclosure without deviating therefrom. For example, in various aspects of the disclosure, methods and compositions were described according to aspects of the presently disclosed subject matter. However, other equivalent methods or composition to these described aspects are also contemplated by the teachings herein. Therefore, the present disclosure should not be limited to any single aspect, but rather construed in breadth and scope in accordance with the appended claims.

What is claimed is:

1. A method comprising:

directionally etching at least a first portion of a barrier layer conforming to one or more surfaces of a predetermined pattern of a metal layer orthogonal to the directional etching such that:

at least a portion of a seed layer comprising a metal material and the metal layer are exposed; and at least a second portion of the barrier layer conforming to one or more surfaces of the predetermined pattern of the metal layer parallel to the direction of the directional etching remains on the metal layer; and etching the exposed portion of the seed layer with an etching material that has a low reactivity with the barrier layer such that the second portion of the barrier layer remains on the metal layer.

2. The method of claim 1 further comprising:

etching the second portion of the barrier layer with a material that has a low reactivity with the metal material such that metal in the predetermined pattern remains on a substrate positioned under the metal layer.

3. The method of claim 2 further comprising:

etching an intermediate layer positioned between the seed layer and the substrate in conjunction with the barrier layer such that the metal in the predetermined pattern remains on the substrate.

4. The method of claim 1 further comprising:

depositing the seed layer onto the substrate, the substrate comprising a dielectric material;

depositing the metal layer onto the seed layer, the metal layer being deposited in the predetermined pattern onto the seed layer; and coating the metal layer with the barrier layer such that the barrier layer conforms to the predetermined pattern of the metal layer;

wherein:

etching the exposed portion of the seed layer removes the seed layer from the substrate; and depositing the metal layer onto the seed layer comprises:

depositing a photoresist material onto the seed layer, the deposition including photoresist application, photolithography, and photoresist development;

electro-depositing the metal material into the predetermined pattern determined by the photoresist material; and stripping the photoresist material such that the metal material remains on the metal layer in the predetermined pattern.

5. The method of claim 4, wherein coating the metal layer with the barrier layer comprises:

coating the metal layer with a barrier precursor; and causing a chemical reaction in the barrier precursor to form the barrier layer.

6. The method of claim 4, wherein coating the metal layer with the barrier layer is performed by one or more of: physical vapor deposition, chemical vapor deposition, sputtering, atomic layer deposition, spray coating, or liquid coating.

7. The method of claim 1, wherein directionally etching the barrier layer is performed by reactive ion etching or wet chemical etching.

8. The method of claim 1, wherein directionally etching the barrier layer is performed anisotropically.

9. The method of claim 1, wherein the predetermined pattern results in a metal wire having a width from 0.1 microns to 10 microns.

10. The method of claim 1, wherein the predetermined pattern results in a metal wire having a ratio of width to height from 1:0.1 to 1:10.

11. A method for etch barrier deposition comprising:

depositing a seed layer onto a substrate, the seed layer comprising an active material and the substrate comprising a dielectric material;

depositing an active layer onto the seed layer, the active layer being deposited in a predetermined pattern onto the seed layer;

coating the active layer with a barrier layer comprising an inorganic barrier material such that the barrier layer conforms to the predetermined pattern of the active layer;

directionally etching the barrier layer from a direction orthogonal to the substrate such that at least a portion of the seed layer and the active layer are exposed, wherein at least a portion of the barrier layer oriented parallel to the direction of the directional etching remains coated on the active layer;

etching the portion of the seed layer to remove the seed layer from the substrate, the etching performed with an etching material that has a low reactivity with the barrier layer such that the portion of the barrier layer remains coated on the active layer; and etching the barrier layer remaining coated on the active layer with a material that has a low reactivity with the active material such that the active material in the predetermined pattern remains on the substrate.

12. The method of claim 11 further comprising:

depositing an intermediate layer between the seed layer and the substrate, the intermediate layer providing adhesion between the seed layer and the substrate; and etching the intermediate layer in conjunction with the barrier layer such that the active material in the predetermined pattern remains on the substrate.

13. The method of claim 11, wherein depositing the active layer onto the seed layer comprises:

depositing a photoresist material onto the seed layer, the deposition including photoresist application, photolithography, and photoresist development;

electro-depositing the active material into the predetermined pattern determined by the photoresist material; and stripping the photoresist material such that the active material remains on the active layer in the predetermined pattern.

14. The method of claim 11, wherein coating the active layer with the barrier layer comprises:

coating the active layer with a barrier precursor; and causing a chemical reaction in the barrier precursor to form the barrier layer.

15. The method of claim 11, wherein coating the active layer with the barrier layer is performed by one or more of: physical vapor deposition, chemical vapor deposition, sputtering, atomic layer deposition, spray coating, or liquid coating.

16. The method of claim 11, wherein the active material comprises one or more of: a metal, a ceramic, a polymer, an organic material, or an inorganic material.

17. A method comprising:

forming fine line redistribution layers (RDLs) having a width less than 5 microns on a panel-based organic package substrate comprising:

depositing a seed layer onto the substrate, the seed layer comprising an active material and the substrate comprising a dielectric material;

depositing a photoresist material onto the seed layer, the deposition including photoresist application, photolithography, and photoresist development;

electro-depositing the active material into a predetermined pattern of the RDLs determined by the photoresist material;

stripping the photoresist material such that the active material remains on the active layer in the predetermined pattern;

coating the active layer with a barrier layer comprising an inorganic barrier material such that the barrier layer conforms to the predetermined pattern of the active layer;

directionally etching the barrier layer from a direction orthogonal to the substrate such that at least a portion of the seed layer and the active layer are exposed, wherein at least a portion of the barrier layer oriented parallel to the direction of the directional etching remains coated on the active layer; and etching the portion of the seed layer to remove the seed layer from the substrate, the etching performed with an etching material that has a low reactivity with the barrier layer such that the portion of the barrier layer remains coated on the active layer.

18. The method of claim 17 further comprising:

etching the barrier layer remaining coated on the active layer with a material that has a low reactivity with the active material such that the active material in the predetermined pattern remains on the substrate.

19. The method of claim 17, wherein the active material comprises one or more of: a metal, a ceramic, a polymer, an organic material, or an inorganic material.

20. The method of claim 17, wherein directionally etching the barrier layer is performed by one or more of: plasma etching, reactive ion etching, or wet chemical etching.

* * * * *